United States Patent
Broszat et al.

(10) Patent No.: US 10,066,486 B2
(45) Date of Patent: Sep. 4, 2018

(54) METHOD FOR DESIGNING A TURBINE

(71) Applicant: MTU Aero Engines AG, Munich (DE)

(72) Inventors: Dominik Broszat, Unterfoehring (DE); Nicolas Thouault, Munich (DE)

(73) Assignee: MTU Aero Engines AG, Munich (DE)

( * ) Notice: Subject to any disclaimer, the term of this patent is extended or adjusted under 35 U.S.C. 154(b) by 381 days.

(21) Appl. No.: 14/657,422

(22) Filed: Mar. 13, 2015

(65) Prior Publication Data

US 2015/0260046 A1 Sep. 17, 2015

(30) Foreign Application Priority Data

Mar. 14, 2014 (DE) .................. 10 2014 204 725

(51) Int. Cl.
*F01D 5/10* (2006.01)
*F01D 5/14* (2006.01)
(Continued)

(52) U.S. Cl.
CPC ................ *F01D 5/10* (2013.01); *F01D 1/04* (2013.01); *F01D 5/022* (2013.01); *F01D 5/142* (2013.01);
(Continued)

(58) Field of Classification Search
CPC ... F01D 5/10; F01D 1/04; F01D 5/022; F01D 5/142; F01D 5/16; F01D 9/041;
(Continued)

(56) References Cited

U.S. PATENT DOCUMENTS 7,806,651 B2  10/2010 Kennepohl et al.
8,534,991 B2  9/2013 Topol et al.
(Continued)

FOREIGN PATENT DOCUMENTS

EP          1738061        1/2007
WO    WO 2013/186756      12/2013
WO      WO2013186756      12/2013

*Primary Examiner* — Dwayne J White
*Assistant Examiner* — Peter T Hrubiec
(74) *Attorney, Agent, or Firm* — Davidson, Davidson & Kappel, LLC

(57) ABSTRACT

A method for designing a turbine having a plurality of stages disposed axially one behind the other in the direction of flow through the turbine, each stage being formed of a stationary row of a plurality of stator vanes and a rotating row of a plurality of rotor blades. The row of rotor blades of at least one of these stages has a plurality of rotor blade clusters each formed of at least two rotor blades ($A_1$, $B_1$; $A_2$, $B_2$) having different airfoil profiles and/or different distances ($\varphi A$, $\varphi B$) from adjacent rotor blades following in the direction of rotation. A vane-to-blade-cluster ratio (V/(B/P)) parameter indicates the ratio of the number of stator vanes (V) to the quotient (B/P) of the number of rotor blades (B) of the stage divided by the number of rotor blades per rotor blade cluster (P). Under a predetermined operating condition of the turbine, this vane-to-blade-cluster ratio parameter is above an upper cut-off limit or below a lower cut-off limit for the modes k=−1, k=−2 and/or k=−3, in particular above an upper cut-off limit for the mode k=−1 or between a lower cut-off limit for the mode k=−1 and an upper cut-off limit for the mode k=−2, of a frequency defined by a ratio of the blade-passing frequency to the number of rotor blades per rotor blade cluster or an integral multiple of this ratio.

17 Claims, 1 Drawing Sheet

(51) Int. Cl.
*F01D 9/04* (2006.01)
*F01D 5/02* (2006.01)
*F01D 1/04* (2006.01)
*F01D 5/16* (2006.01)
*G06F 17/50* (2006.01)

(52) U.S. Cl.
CPC ............... *F01D 5/16* (2013.01); *F01D 9/041* (2013.01); *G06F 17/50* (2013.01); *F05D 2220/323* (2013.01); *F05D 2240/12* (2013.01); *F05D 2240/24* (2013.01); *F05D 2260/961* (2013.01); *Y02T 50/673* (2013.01)

(58) Field of Classification Search
CPC .. F01D 25/04; F05D 2240/12; F05D 2240/24; F05D 2260/961
See application file for complete search history.

(56) References Cited

U.S. PATENT DOCUMENTS

| | | |
|---|---|---|
| 2012/0099995 A1 | 4/2012 | Delvaux et al. |
| 2014/0050590 A1 | 2/2014 | Ghorbani Zarimahalleh et al. |
| 2015/0110604 A1* | 4/2015 | Calza ........................ F01D 5/16 415/119 |

* cited by examiner

METHOD FOR DESIGNING A TURBINE

This claims the benefit of German Patent Application DE 10 2014 204 725.0, filed Mar. 14, 2014 and hereby incorporated by reference herein.

The present invention relates to a method for designing a turbine, in particular a low-pressure turbine, of a gas turbine engine, in particular of an aircraft engine, a computer program product for carrying out the method, and to a correspondingly designed turbine.

BACKGROUND

Commonly-assigned European Patent EP 1 738 061 B1 and related U.S. Pat. No. 7,806,651 B2, which are additionally made reference to herein and the contents of both of which are hereby expressly incorporated into the present disclosure, describe a method for designing a turbine and a turbine.

SUMMARY OF THE INVENTION

These patents propose to design at least one stage of the turbine in such a way that, under noise-critical operating conditions of the turbine, a vane-to-blade ratio parameter which indicates the ratio of the number of stator vanes to the number of rotor blades of the stage is between a lower cut-off limit for mode $k=-1$ of the blade-passing frequency of this stage and an upper cut-off limit for mode $k=-2$ of the blade-passing frequency of this stage in order to improve the level of noise emitted by the turbine.

It is an object of an embodiment of the present invention to improve a turbine of a gas turbine engine.

The present invention provides a turbine of a gas turbine engine that has a plurality of stages disposed axially one behind the other in the direction of flow through the turbine. Each stage is formed of a stationary row of a plurality of stator vanes and a rotating row of a plurality of rotor blades disposed adjacent to the stator vane row, either downstream or upstream thereof in the direction of flow. Thus, the stator vane row of a stage may be the inlet vane row of this stage or the exit vane row of this stage; i.e., the inlet vane row of a further stage disposed adjacent thereto and downstream thereof in the direction of flow.

The turbine may in particular be a single- or multi-stage low-pressure turbine, which may be disposed downstream of a single- or multi-stage high-pressure or intermediate-pressure turbine and/or upstream of a turbine exit case (TEC) in the direction of flow. The gas turbine engine may in particular be an aircraft gas turbine engine. In an embodiment, it has a combustion chamber disposed upstream of the turbine and one or more single- or multi-stage compressors disposed upstream of this combustion chamber. The aircraft gas turbine engine may in particular have a fan, which may be coupled to the low-pressure turbine via a transmission.

In accordance with an aspect of the present invention, the row of rotor blades of one or more stages of the to-be-designed or designed turbine includes, in each case, a plurality of rotor blade clusters. In one embodiment, the row of rotor blades is formed of the plurality of rotor blade clusters and does not include any rotor blades other than those of the rotor blade clusters.

The stage may be a stage, in particular a first stage, disposed upstream of a further stage, or a stage, in particular a last stage, disposed downstream of a further stage of the turbine in the direction of flow. In one embodiment, the rotor blade clusters of the stage are identical to one another. In one embodiment, the rotor blade clusters are each formed of at least two rotor blades having different airfoil profiles. Airfoil profiles which are different from each other may in particular have different airfoil thicknesses, airfoil thickness distributions, twist and/or stagger distributions and/or airfoil types. In addition or alternatively, in one embodiment, the rotor blade clusters are each formed of at least two rotor blades having different distances from adjacent rotor blades following in the direction of rotation. The rotor blades of a rotor blade cluster may be detachably or permanently connected to each other, in particular integrally formed with one another.

Due to such periodically successive rotor blade clusters, in addition to the blade-passing frequency and the harmonics thereof, which are discussed in European Patent EP 1 738 061 B1 and the related U.S. patent mentioned at the outset, acoustic contributions occur also at (lower) frequencies corresponding to the periodicity of the circumferential distribution of the rotor blade clusters. Thus, for example, in the case of a stage whose blade row ABABAB . . . is formed of alternating blades A, B; i.e., of rotor blade clusters (AB) which are identical to one another, an acoustic contribution occurs at half the blade-passing frequency and the harmonics thereof.

By placing (also or only) such acoustic contributions into a cut-off region, it is possible to improve a level of noise emitted by the turbine.

A stage having a plurality of rotor blade clusters, each including at least two rotor blades having different airfoil profiles and/or different distances from adjacent rotor blades following in the direction of rotation, is characterized by a vane-to-blade-cluster ratio $V/(B/P)$ parameter which indicates the ratio of the number of stator vanes V to the quotient $(B/P)$ of the number of rotor blades B of the stage divided by the number of rotor blades P per rotor blade cluster. Thus, P corresponds to a periodicity of the circumferential distribution of the rotor blade clusters. If the rotor blade clusters of the stage have different blade numbers, the number of rotor blades P per rotor blade cluster may, in the context of the present invention, be the maximum, minimum, or average or mean number of rotor blades per rotor blade cluster.

If in one embodiment for example, all of the rotor blade clusters forming one stage are formed of a first rotor blade A and a second rotor blade B which has a different airfoil profile than blade A and/or a different distance than blade A from an adjacent rotor blade following in the direction of rotation, then this stage has the pattern (AB)(AB)(AB) . . . and a periodicity or number of rotor blades P per rotor blade cluster of 2.

However, if in another embodiment, for example, all of the rotor blade clusters forming one stage are formed of a first rotor blade A and a second rotor blade B which has a different airfoil profile than blade A and/or a different distance than blade A from an adjacent rotor blade following in the direction of rotation, and an additional first rotor blade A or a third rotor blade C which has a different airfoil profile than blade A and blade B and/or a different distance than blade A and blade B from an adjacent rotor blade following in the direction of rotation, then this stage has the pattern (ABA)(ABA)(ABA) . . . or (ABC)(ABC)(ABC) . . . , respectively, and a periodicity or number of rotor blades P per rotor blade cluster of 3.

In accordance with an aspect of the present invention, this stage is now designed in such a way that, under a predetermined operating condition of the turbine, this vane-to-blade-cluster ratio parameter is above an upper cut-off limit or below a lower cut-off limit for modes $k=-1$, $k=-2$ and/or k=−3, in particular above an upper cut-off limit for mode k=−1 or between a lower cut-off limit for mode k=−1 and an upper cut-off limit for mode k=−2, at a frequency f/P defined by the ratio of the blade-passing frequency f to the number of rotor blades per rotor blade cluster P or an integral multiple 2·(f/P), 3·(f/P), . . . of this ratio, in particular twice or three times this ratio.

As described earlier, by so placing an acoustic contribution at the (lower) frequency corresponding to the periodicity of the circumferential distribution of the rotor blade clusters into a cut-off region, it is possible to reduce a level of noise emitted by the turbine.

The predetermined operating condition may in particular be a noise-critical operating condition, as discussed in European Patent EP 1 738 061 B1 or the related U.S. patent mentioned at the outset, in particular a take-off operation, an approach for landing and/or taxiing on a taxiway of an aircraft having the turbine.

As is generally known, the blade-passing frequency refers to the frequency with which the rotating rotor blades rotate past a stationary stator vane of the stage.

In one embodiment, the rotor blade clusters of the stage are each formed of exactly two rotor blades having different airfoil profiles and/or different distances from adjacent rotor blades following in the direction of rotation. In particular, in one embodiment, this stage has the pattern (AB)(AB)(AB) . . . and a periodicity or number of rotor blades P per rotor blade cluster of 2.

In another embodiment, the rotor blade clusters of the stage are each formed of at least three, in particular exactly three, rotor blades, two or all of which have pairwise different airfoil profiles and/or different distances from adjacent rotor blades following in the direction of rotation. In particular, the rotor blade clusters of this stage may each have, in particular be formed of, a first blade A, a second rotor blade B adjacent thereto and following in the direction of rotation, and an additional first rotor blade A or a third rotor blade C adjacent thereto and following in the direction of rotation; the first, second and third rotor blades having different airfoil profiles and/or different distances from adjacent rotor blades following in the direction of rotation. Then, this stage may in particular have the pattern (ABA)(ABA)(ABA) . . . or (ABC)(ABC)(ABC) . . . , respectively, and a periodicity or number of rotor blades P per rotor blade cluster of 3.

In one embodiment, the rotor blade clusters of the stage are each formed of at least four, in particular exactly four, rotor blades, two, three or all of which have pairwise different airfoil profiles and/or different distances from adjacent rotor blades following in the direction of rotation. In particular, the rotor blade clusters of this stage may each have, in particular be formed of, a first blade A, a second rotor blade B adjacent thereto and following in the direction of rotation, an additional first rotor blade A or a third rotor blade C adjacent thereto and following in the direction of rotation, and an additional first blade A, an additional second rotor blade B, an additional third rotor blade C or a fourth blade D adjacent thereto and following in the direction of rotation; the first, second, third and fourth rotor blades having different airfoil profiles and/or different distances from adjacent rotor blades following in the direction of rotation. Then, this stage may in particular have the pattern (ABCD)(ABCD)(ABCD) . . . or (ABAC)(ABAC)(ABAC) . . . , respectively, and a periodicity or number of rotor blades P per rotor blade cluster of 4.

As explained above, acoustic contributions at frequencies corresponding to the periodicity of the circumferential distribution of the rotor blade clusters can be placed into a cut-off region in addition to the acoustic contributions at the blade-passing frequency and/or the harmonics thereof. Accordingly, in one embodiment, the stage may be designed in such a way that, under a predetermined operating condition of the turbine, a vane-to-blade ratio parameter which indicates the ratio of the number of stator vanes to the number of rotor blades of the stage is above an upper cut-off limit or below a lower cut-off limit for modes k=−1, k=−2 and/or k=−3, in particular above an upper cut-off limit for mode k=−1 or between a lower cut-off limit for mode k=−1 and an upper cut-off limit for mode k=−2, of the blade-passing frequency or an integral multiple thereof.

It is also possible to place into a cut-off region only these acoustic contributions at frequencies corresponding to the periodicity of the circumferential distribution. Accordingly, in one embodiment, the stage may, in addition, be designed in such a way that, contrary to the teaching of European Patent EP 1 738 061 B1 or the related U.S. patent, under the predetermined operating condition of the turbine, a vane-to-blade ratio parameter which indicates the ratio of the number of stator vanes to the number of rotor blades of the stage is below an upper cut-off limit and above a lower cut-off limit for modes k=−1, k=−2 and/or k=−3, in particular below an upper cut-off limit for mode k=−1 and above a lower cut-off limit for modes k=−1, k=−2 and/or k=−3 of the blade-passing frequency.

In an embodiment, one or more stages, in particular all stages, are designed in such a way that the vane-to-blade ratio parameter which indicates the ratio of the number of stator vanes to the number of rotor blades of the stage is at least substantially equal to one (V/B=1).

Advantageously, this makes it also possible to improve a level of noise emitted by the turbine and the aerodynamics thereof.

BRIEF DESCRIPTION OF THE DRAWINGS

Further advantageous refinements of the present invention will be apparent from the dependent claims and the following description of preferred embodiments. To this end, the drawings show, partly in schematic form, in:

DETAILED DESCRIPTION

Figure 1:
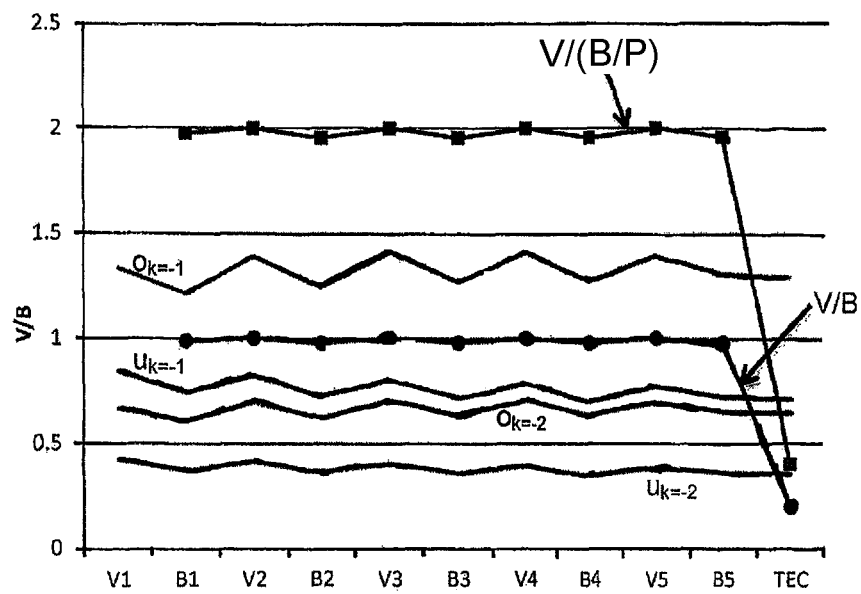
FIG. 1: a diagram for illustrating a low-pressure turbine design according to an embodiment of the present invention.

FIG. 1 shows a diagram for illustrating a low-pressure turbine design according to an embodiment of the present invention, in a depiction style known for example from U.S. Pat. No. 7,806,651 and European Patent EP 1 738 061 B1.

The low-pressure turbine includes a plurality of stages disposed axially one behind the other in the direction of flow through the turbine. Each stage is formed of a stationary vane ring and a rotating blade ring.

The stator vane ring has a plurality of stationary stator vanes. The rotating blade ring of each stage has a plurality of rotating rotor blades.

Figure 2:
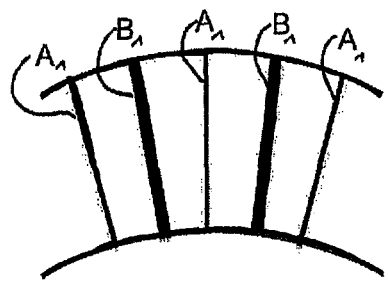
FIG. 2: a portion of a row of rotor blades of a stage of the low-pressure turbine of FIG. 1 according to an embodiment of the present invention.

FIG. 2 shows a portion of a rotor blade ring of a stage of the low-pressure turbine, which rotor blade ring has a plurality of rotor blade clusters $(A_1B_1)(A_1B_1)\ldots$, which are each formed of two rotor blades $A_1$, $B_1$ having different airfoil profiles.

Figure 3:
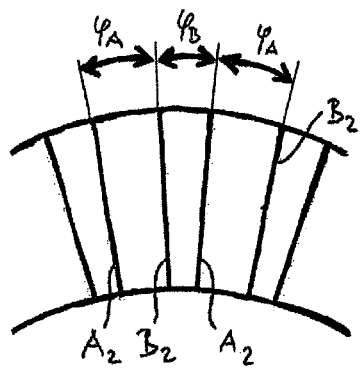
FIG. 3: a portion of a row of rotor blades of a stage of the low-pressure turbine of FIG. 1 according to an embodiment of the present invention.

FIG. 3 shows a portion of a rotor blade ring of a stage of the low-pressure turbine, which rotor blade ring has a plurality of rotor blade clusters $(A_2B_2)(A_2B_2)\ldots$, which are each formed of two rotor blades $A_2$, $B_2$ having identical airfoil profiles and different distances $\varphi A$, $\varphi B$ from adjacent rotor blades following in the direction of rotation.

These stages are characterized by a vane-to-blade-cluster ratio V/(B/P) parameter which indicates the ratio of the number of stator vanes V of the stage to the quotient (B/P) of the number of rotor blades (B) of the stage divided by the number of rotor blades P=2 per rotor blade cluster, and which is indicated in FIG. 1.

These stages are designed in such a way that, under a noise-critical operating condition of the turbine, this vane-to-blade-cluster ratio parameter is above an upper cut-off limit or below a lower cut-off limit for modes k=−1, k=−2 and/or k=−3, and in particular above an upper cut-off limit for mode k=−1 or between a lower cut-off limit for mode k=−1 and an upper cut-off limit for mode k=−2, at a frequency defined by the ratio of the blade-passing frequency to the number of rotor blades per rotor blade cluster or an integral multiple of this ratio, so that the low-pressure turbine emits a lowest possible level of noise during such noise-critical operating conditions. Such noise-critical operating conditions are, for example, a take-off or a landing approach of an aircraft, or taxiing of the aircraft on a taxiway of an airport.

Also plotted in FIG. 1 are the vane-to-blade ratio (V/B) and an upper and lower cut-off limit $o_{k=-1}$ and $u_{k=-1}$ for mode k=−1 of the blade-passing-frequency and an upper and lower cut-off limit $o_{k=-2}$ and $u_{k=-2}$ for mode k=−2 of the blade-passing frequency (BPF) of the respective stage. In the diagram, there are plotted five stages; i.e., their stator vane rings V1 through V5 and rotor blade rings B1 through B5, as well as turbine exit case TEC.

It can be seen that, under the noise-critical operating condition of the turbine, the vane-to-blade ratio (VB) which indicates the ratio of the number of stator vanes to the number of rotor blades of the stage is below upper cut-off limit $o_{k=-1}$ and above lower cut-off limit $u_{k=-1}$ for mode k=−1 of the blade-passing frequency. The vane-to-blade-cluster ratio V/(B/P) is above upper cut-off limit $o_{k=-1}$.

Although the above is a description of exemplary embodiments, it should be noted that many modifications are possible. It should also be appreciated that the exemplary embodiments are only examples, and are not intended to limit the scope, applicability, or configuration in any way. Rather, the foregoing detailed description provides those skilled in the art with a convenient road map for implementing at least one exemplary embodiment, it being understood that various changes may be made in the function and arrangement of elements described without departing from the scope of protection set forth in the appended claims and their equivalent combinations of features.

LIST OF REFERENCE NUMERALS $A_1$, $B_1$; $A_2$, $B_2$ rotor blades
B number of rotor blades
$\varphi_A$, $\varphi_B$ distances between blades
V/(B/P) vane-to-blade-cluster ratio
V number of stator vanes
P periodicity
$o_{k=-1}$, $o_{k=-2}$ upper cut-off limit
$u_{k=-1}$, $u_{k=-2}$ lower cut-off limit

What is claimed is:

1. A method for designing a turbine having a plurality of stages disposed axially one behind the other in the direction of flow through the turbine, each stage being formed of a stationary row of a plurality of stator vanes and a rotating row of a plurality of rotor blades, the row of rotor blades of at least one of the stages having a plurality of rotor blade clusters each formed of at least two of the rotor blades having different airfoil profiles or different distances from adjacent rotor blades following in the direction of rotation, the stage having a vane-to-blade-cluster ratio (V/(B/P)) parameter indicating the ratio of the number of stator vanes (V) to the quotient (B/P) of the number of rotor blades (B) of the stage divided by the number of rotor blades per rotor blade cluster (P), the method comprising:

designing the stage in such a way that, under a predetermined operating condition of the turbine, the vane-to-blade-cluster ratio parameter is above an upper cut-off limit for the mode k=−1 or between a lower cut-off limit for the mode k=−1 and an upper cut-off limit for the mode k=−2, of a frequency defined by a ratio of the blade-passing frequency to the number of rotor blades per rotor blade cluster or an integral multiple of this ratio.

2. The method as recited in claim 1 wherein the stage is a stage disposed upstream of a further stage, or a stage disposed downstream of a yet further stage of the turbine in the direction of flow.

3. The method as recited in claim 1 wherein the at least two of the rotor blades have different airfoil profiles different from each other by having different airfoil thicknesses, airfoil thickness distributions, twist or stagger distributions or airfoil types.

4. The method as recited in claim 1 wherein the stage is designed in such a way that, under the predetermined operating condition of the turbine, a vane-to-blade ratio parameter indicating the ratio of the number of stator vanes to the number of rotor blades of the stage is below an upper cut-off limit ($o_{k=-1}$, $o_{k=-2}$) and above a lower cut-off limit ($u_{k=-1}$, $u_{k=-2}$) for the modes k=−1 or k=−2 and above a lower cut-off limit for the modes k=−1 or k=−2 of the blade-passing frequency.

5. A turbine of a gas turbine engine comprising:

a plurality of stages disposed axially one behind the other in the direction of flow through the turbine, each stage being formed of a stationary row of a plurality of stator vanes and a rotating row of a plurality of rotor blades, the row of rotor blades of at least one of these stages having a plurality of rotor blade clusters which are each formed of at least two rotor blades having different airfoil profiles or different distances from adjacent rotor blades following in the direction of rotation;

the at least one stage having a vane-to-blade-cluster ratio (V/(B/P)) parameter indicating the ratio of the number of stator vanes (V) to the quotient (B/P) of the number of rotor blades (B) of the stage divided by the number of rotor blades per rotor blade cluster (P); and the stage having, under a predetermined operating condition of the turbine, the vane-to-blade-cluster ratio parameter above an upper cut-off limit for the mode k=−1 or k=−3 or between a lower cut-off limit for the mode k=−1 and an upper cut-off limit for the mode k=−2, of a frequency defined by a ratio of the blade-passing frequency to the number of rotor blades per rotor blade cluster or an integral multiple of this ratio.

6. The turbine as recited in claim 5 wherein the row of rotor blades of these stages is formed of the plurality of rotor blade clusters.

7. The turbine as recited in claim 5 wherein the rotor blade clusters of this stage are identical to one another.

8. The turbine as recited in claim 5 wherein the rotor blade clusters of the stage are each formed of at least two rotor blades.

9. The turbine as recited in claim 5 wherein the rotor blade clusters of the stage are each formed of at least four rotor blades.

10. The turbine as recited in claim 5 wherein the rotor blade clusters of the stage each have a first blade, a second rotor blade adjacent thereto and following in the direction of rotation, and an additional first rotor blade or a third rotor blade adjacent thereto and following in the direction of rotation; the first, second and third rotor blades having different airfoil profiles or different distances from adjacent rotor blades following in the direction of rotation.

11. The turbine as recited in claim 5 wherein the stage is a stage disposed upstream of a further stage, or a stage disposed downstream of a yet further stage of the turbine in the direction of flow.

12. The turbine as recited in claim 11 wherein the stage is a first stage of the turbine.

13. The turbine as recited in claim 11 wherein the stage is a last stage of the turbine.

14. The turbine as recited in claim 5 wherein the stage is designed in such a way that, under the predetermined operating condition of the turbine, a vane-to-blade ratio parameter indicating the ratio of the number of stator vanes to the number of rotor blades of the stage is below an upper cut-off limit ($o_{k=-1}$, $o_{k=-2}$) and above a lower cut-off limit ($u_{k=-1}$, $u_{k=-2}$) for the modes k=−1 or k=−2 and above a lower cut-off limit for the modes k=−1 or k=−2 of the blade-passing frequency.

15. The turbine as recited in claim 14 wherein under the predetermined operating condition of the turbine, a vane-to-blade ratio parameter indicating the ratio of the number of stator vanes to the number of rotor blades of the stage is below an upper cut-off limit for the mode k=−1.

16. A low-pressure turbine comprising the turbine as recited in claim 5.

17. An aircraft engine comprising the turbine as recited in claim 5.

* * * * *